United States Patent [19]

Bianco

[11] Patent Number: 4,582,987
[45] Date of Patent: Apr. 15, 1986

[54] BAR CODED INDEX TAB HOLDER

[76] Inventor: James S. Bianco, 217 Brainard Rd., Enfield, Conn. 06082

[21] Appl. No.: 500,019

[22] Filed: Jun. 1, 1983

[51] Int. Cl.[4] .............................................. G06K 7/00
[52] U.S. Cl. ................................... 235/486; 40/10 R; 40/23 A; 235/385; 235/495
[58] Field of Search ............... 235/462, 485, 486, 495, 235/383, 385; 40/10 R, 11 R, 23 R, 24, 23 A

[56] References Cited

U.S. PATENT DOCUMENTS

| 2,935,804 | 5/1960 | Duckro | 40/10 R |
| 3,062,217 | 11/1962 | Woodhouse | 40/23 A |
| 3,735,350 | 5/1973 | Lemelson | 235/495 X |
| 4,204,639 | 5/1980 | Barber et al. | 235/462 |
| 4,263,503 | 4/1981 | Bianco | 235/487 |

Primary Examiner—David L. Trafton
Attorney, Agent, or Firm—Pennie & Edmonds

[57] ABSTRACT

A bar coded index tab for affixation of a label to an article. The tab has a base (60) including a front face (70) and a notch (80) extending across the front face for affixing thereto a label (20) having machine-readable bar coded information on a portion of the label and human-readable information on another portion of the label. The machine-readable information is read in one portion of the notch and the human-readable information is read in another portion of the notch. Lips (110A and 110B) are provided along each side of the notch to grip the label. The reading instrument is located against one of the lips for movement along the lip to accurately read the bar code information without the necessity for human visual contact with the label. The tab has means (120) for attaching the base to an object to be labelled.

26 Claims, 5 Drawing Figures

BAR CODED INDEX TAB HOLDER

BACKGROUND OF THE INVENTION

1. Technical Field

The present invention relates to a device for holding a bar coded label on an edge of a circuit board or the like, to permit the bar coded label to be read accurately by electronic bar code reading devices.

2. Background Art

Bar code data, in the form of spaced bars contrasting with the background on which they are printed, or the like, have been known for many years. Their use became more extensive when bar code readers or "wands" capable of reading bar codes with very high information density became commercially available. A wand generally takes the form of a pencil-shaped element having electrical leads extending from the top of a housing and connecting internally with an optical reading head responsive to the information encoded in the bar code pattern. By simply moving across the surface of the label, the wand detects and decodes the information for display or storage. Bar codes have been used on equipment, inventoried parts, consumer goods, and a wide variety of other items. By means of bar coding, the efficiency of such processes as inventory control, production, and assembly may be enhanced. Also, bar coding may permit any organization to more easily route and keep track of large numbers of articles of any kind.

In the electronics industry it is common for a given facility to have a multitude of storage racks containing printed circuit (p.c.) boards. When stored in these racks, usually only one edge of each printed circuit board is visible. While use of bar coded labels on p.c. boards would greatly enhance inventory control efficiency, they generally require a wider mounting surface than that afforded by the edge of the board. Placing the label on the flat surface of the board would not be efficient because the surfaces are not accessible when the boards are stored in racks.

To further enhance inventory control, it would be desirable to have inventory-control or part numbers of a printed circuit board visible in both machine-readable (bar coded) and human-readable form, both accessible without removing the boards from their storage rack.

SUMMARY OF THE INVENTION

It is a feature of the invention to provide a bar code label holder which securely affixes a label to the edge of a printed circuit board for reading the label from outside a storage rack.

It is another feature of the invention to provide a bar code label holder which allows the reading of label information in both machine-readable and human-readable form.

It is a third feature of the invention to permit the reading of machine-readable bar codes by use of an optical wand, without requiring human visual contact in order to align the wand with the bar code strip.

The foregoing features are achieved according to illustrative embodiments of the invention by affixing to printed circuit boards index tabs capable of displaying machine-readable and human-readable identification information, comprising a base member attachable to a p.c. board or other article and including a front face, with a notch extending across the front face for affixing a label thereto, bearing machine-readable and human-readable information. In a preferred embodiment of the invention a lip is provided along each side of the notch to grip the edges of such label and to provide a guide surface whereby a reading instrument, such as a bar code wand, may be located against one of the lips for movement along the lip to accurately read the bar code information without the necessity of human visual contact with the label.

BRIEF DESCRIPTION OF THE DRAWINGS

Further features and advantages of the invention will be described in connection with the accompanying drawings, wherein.

BEST MODE FOR CARRYING OUT THE INVENTION

Figure 1:
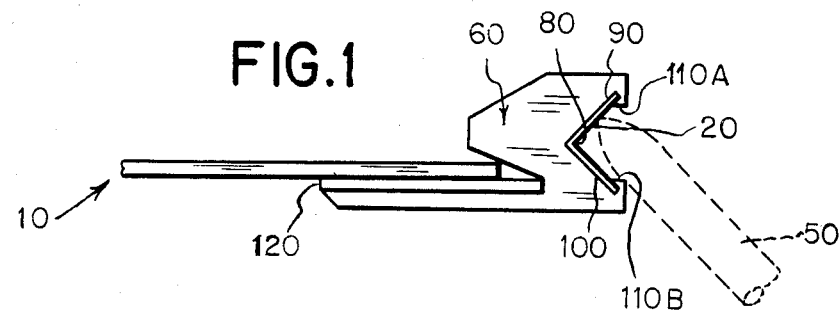
FIG. 1 is a side elevational view of an embodiment of a bar coded index tab attached to a printed circuit board, showing the position of an optical reading wand in phantom view.
Figure 2:
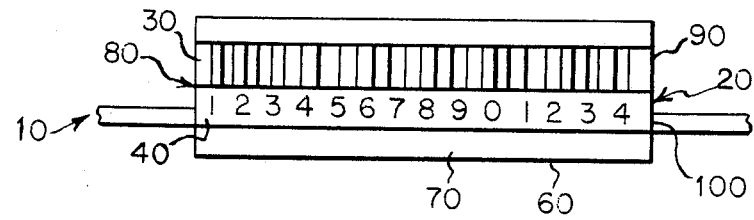
FIG. 2 is a front elevational view of a bar coded index tab affixed to the end of a printed circuit board as in FIG. 1.

According to a preferred embodiment of the invention, a printed circuit board 10 is provided with a base 60 which holds a label 20, as shown in FIGS. 1 and 2.

A typical label 20 has machine-readable bar coded information 30 on a portion of the label and human-readable information 40 on another portion of the label. In this manner, the machine-readable information 30 can be read by drawing an optical scanning wand 50 across the surface of the label 20, as shown in FIG. 1. The other portion of the label, bearing human-readable information, is presented so as to be visible to the human eye without removing the p.c. board from its storage rack.

Figure 3:
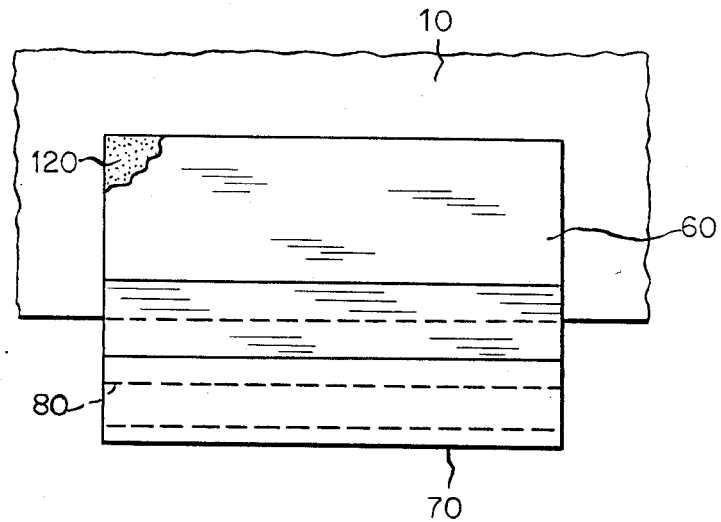
FIG. 3 is a partially cut-away plan view of the bar coded index tab affixed to a printed circuit board as in FIGS. 1 and 2.

Base 60 affixes label 20 to printed circuit board 10 as shown in FIGS. 1 through 3. The base 60 has a front face 70. The front face 60 has a notch 80, as shown in FIGS. 1, 2, 4, and 5. As shown in FIG. 1, the notch 80 has a V-shaped cross-sectional profile. The notch 80 has an upper face 90 and a lower face 100, as shown in FIGS. 1 and 2.

Label 20 may include an adhesive backing (not shown) for affixing the label to notch 80 of base 60. Notch faces 90 and 100 allow adhesion of the label to their surfaces. The adhesive backing prevents shifting of label 20 within the notch 80 when the label is read by optical scanning wand 50.

After affixation of the label 20 to the notch, as shown in FIG. 2, machine-readable bar code information 30 runs along the upper face 90 of notch 80, and the human-readable information 40 runs along the lower face 100 of notch 80. In this manner, machine-readable information 30 is read from the upper face 90 of notch 80 while the human-readable information 40 is read from the lower face 100 of notch 80. FIG. 1 shows the machine-readable bar coded information 30 being read from label 20 along the upper face 90 of notch 80 by an optical scanning wand 50.

Lips 110A and 110B are provided along the outer edges of notch faces 90 and 100 where they intersect the front face 70 of the base 60. The edges of label 20 are retained under the lips 110A and 110B.

The lips 110A and 110B also provide a guide surface for optical scanning wand 50 as shown in FIG. 1, whereby the wand may be located against lip 110B, as shown in FIG. 1, and moved along the lip. This assures accurate reading of the bar code information without the necessity for human visual contact with the label, which would otherwise be necessary to verify alignment of the wand 50. By eliminating the need to visually align the optical scanning wand 50 with the machine-readable code information 30 of label 20, the work speed of an optical wand user may be increased. The user need only locate the wand against the leftmost portion of lip 110B and move wand 50 along lip 110B will he or she reaches the rightmost portion of the bar code information 30 of label 20. Such rapid wiping motions allow faster optical data input into an inventory data processing system.

Means are provided for attaching the base 60 to an object to be tagged such as a printed circuit board. FIGS. 1 and 3 show the use of a double-sided adhesive strip 120 to affix the base 60 to printed circuit board 10.

Figure 4:
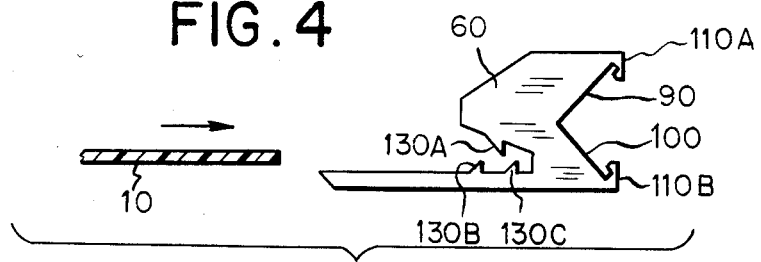
FIG. 4 is a side elevational view of an alternate embodiment of a bar coded index tab.
Figure 5:
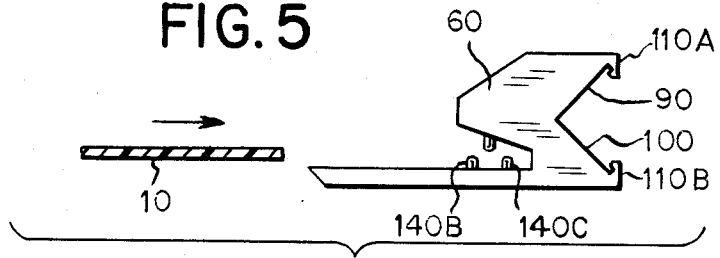
FIG. 5 is a side elevational view of another alternate embodiment of a bar coded index tab.

FIGS. 4 and 5 show alternate means for attaching the base 60 to an object, such as printed circuit board 10. FIG. 4 shows the use of a plurality of teeth 130A, 130B, and 130C, which allow easy insertion of p.c. board 10 into the base 50 but do not allow easy removal of the board from the base. In applications such as the printed circuit field, it is desirable that the teeth not score the surface of the p.c. boards to which they are affixed, in order to avoid damage to the board surfaces. Accordingly, the gap between teeth of opposing sides is spaced to provide gripping tension insufficient to score the printed circuit board.

FIG. 5 shows the use of dimple projections 140A, 140B, and 140C, to provide gripping tension on the object to which the bar coded tag is affixed, such as printed circuit board 10. It is desirable that the dimple projections not score the surface of the printed circuit board. Therefore, the gap between projections of opposing sides is spaced to provide gripping force sufficient to affix base 60 to p.c. board 10, but not sufficient to score the board surface.

Bar coded tag base 60 may also be affixed to objects by the use of pins or rivets (not shown) which are familiar to those skilled in the art of tag affixation.

What is claimed is:

1. A label holder for affixing a label to an object, comprising:
   (a) a base, including a front surface having a V-shaped cross-section extending across the base for affixing the label thereto, the label having machine-readable bar code information on a first portion of the label and human-readable information on a second portion;
   wherein after label affixation, the machine-readable information is readable by a reading wand supported on the base adjacent said second portion of the label having a reading tip securely contacting said first portion of the label, and the human-readable information is readable on said second portion of the label; and
   (b) means for attaching the base to the object.

2. A label holder for affixing a label to an object, comprising:
   (a) a base, including
     (i) a front surface having a V-shaped cross-section extending across the base for affixing the label thereto, the label having machine-readable bar code information on one portion of the label and human-readable information on another portion; the machine-readable information being readable on a first portion of the surface and the human-readable information being readable on a second portion of the surface; and
     (ii) lip means along each side of the surface, each lip means being adjacent a respective one of said surface portions, providing a guide surface adjacent said second surface portion whereon a reading instrument having a reading tip may be located for movement along the guide surface with its reading tip securely contacting said first surface portion so as to accurately read the bar code information without the necessity of human visual contact with the label,
   said V-shaped cross-section having a relatively small vertex angle, whereby the reading tip of the reading instrument supported on the guide surface may be oriented with a relatively large angle of incidence and substantial contact friction against the first surface portion to enable said above-mentioned secure reading contact and avoid substantial slippage; and
   (b) means for attaching the base to the object.

3. An index tab according to claim 1, wherein the notch has a face which allows adhesion of an adhesive label to prevent movement of the label within the notch.

4. A label holder according to claim 1, wherein the surface of the front face has a V-shaped cross-sectional profile with a relatively small vertex angle, whereby the reading tip of the reading instrument supported on the guide surface may be oriented with a relatively large angle of incidence and substantial contact friction against the first portion of the label to enable such above-mentioned secure reading contact and said bar code information can be read along said first portion of said V-shaped surface without substantial slippage of said tip.

5. An index tab according to claim 1, wherein the means for attaching the base to an object is a two-sided adhesive strip.

6. An index tab according to claim 1, wherein the means for attaching the base to an object is a plurality of retaining teeth.

7. An index tab according to claim 1, wherein the means for attaching the base to an object is a plurality of dimple projections.

8. An index tab according to claim 1, wherein the means for attaching the base to an object is at least one rivet.

9. An index tab according to claim 1, wherein the means for attaching the base to an object is at least one pin.

10. A label holder for attaching a label to an object, the label having a first part containing machine-readable bar code information to be read by a wand-shaped reading instrument having a reading tip at an end of an elongated shaft, and a second part containing human-readable information, comprising
    (a) mount means for attachment to the object, and
    (b) upper and lower front faces connected to the mount means to which such first and second parts of such label can be affixed, said faces being generally elongated and having
  (i) inner edges at which said faces are interconnected to form a predetermined vertex angle between said faces, and
  (ii) outer edges generally opposite said inner edges,
(c) said upper and lower front faces being arranged so as to guide such reading instrument for motion
  (i) with its reading tip supported by and engaging the first part of the label for reading the information thereon, and
  (ii) with its shaft supported by said lower face so as to enable secure reading contact of said tip on said first part of the label without human visual contact with the label.

11. A label holder as in claim 10, wherein the outer edges include lip means extending along said outer edges, and the shaft of the reading instrument is supported for reading the bar code information by the lip means extending along the outer edge of the lower face.

12. A label holder as in claim 11, wherein the vertex formed by said faces is located between the first and second parts of the label.

13. A label holder as in claim 10, wherein said predetermined vertex angle is not substantially greater than a right angle.

14. A label holder as in claim 13, wherein said predetermined vertex angle is substantially a right angle.

15. A label holder as in claim 10, wherein the reading instrument is supported at an angle to the upper front face that is not substantially greater than a right angle so as to provide substantial contact friction and thereby provide the above-mentioned secure reading contact between the reading tip and the first part of the label.

16. A label holder as in claim 15, wherein the reading instrument is supported at substantially a right angle to the upper front face.

17. A label holder as in claim 13, wherein said predetermined vertex angle is sufficient to provide visibility of the second portion of the label.

18. A label holder as in claim 2, wherein said vertex angle is not substantially greater than a right angle.

19. A label holder as in claim 18, wherein said vertex angle is substantially a right angle.

20. A label holder as in claim 19, wherein said angle of incidence of the reading tip against the first surface portion containing machine-readable information is substantially a right angle.

21. A label holder as in claim 4, wherein said vertex angle is not substantially greater than a right angle.

22. A label holder as in claim 21, wherein said vertex angle is substantially a right angle.

23. A label holder as in claim 22, wherein said angle of incidence of the reading tip against the first surface portion containing machine-readable information is substantially a right angle.

24. A label holder for attaching a label to an object, such label having a machine-readable part containing bar code information to be read by a wand-shaped reading instrument having a reading tip at an end of a shaft, and a part containing human-readable information, wherein
(a) the label holder has mount means for attachment to such object,
(b) the label holder has a front face for receiving such label, the front face having first and second areas, at least a portion of such machine-readable part of such label being received on the first area of the label holder, and
(c) the first and second areas of the front face arranged and configured to support and orient such reading instrument while in motion for reading such bar code information, such that
  (i) such reading tip is supported by and engages such machine-readable part of such label for reading such bar code information thereon, and
  (ii) such shaft is supported by the second area of the front face and is oriented at such an angle to the first area as to provide secure reading contact of such tip, without human visual contact with such tip or such label, on such machine-readable part of such label received on the first area.

25. A label holder as in claim 24, wherein the first and second areas of the front face are arranged and configured so that such shaft is supported at an angle to the first area that is sufficiently large to substantially avoid slippage of such reading tip from such machine-readable part of such label, and thereby provide such above-mentioned secure reading contact, between such reading tip and such machine-readable part of such label.

26. A label holder as in claim 25, wherein such reading instrument is supported with such shaft at substantially a right angle to the first area.

* * * * *